(12) United States Patent
Suzuki

(10) Patent No.: US 6,337,811 B1
(45) Date of Patent: Jan. 8, 2002

(54) SEMICONDUCTOR DEVICE HAVING SEMICONDUCTOR ELEMENT BECOMES OPERABLE WHEN CONNECTED TO EXTERNAL POWER SOURCE

(75) Inventor: Akira Suzuki, Kunitachi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/700,802
(22) PCT Filed: Mar. 23, 2000
(86) PCT No.: PCT/JP00/01770
§ 371 Date: Nov. 20, 2000
§ 102(e) Date: Nov. 20, 2000
(87) PCT Pub. No.: WO00/57554
PCT Pub. Date: Sep. 28, 2000

(30) Foreign Application Priority Data

Mar. 23, 1999 (JP) ............................................. 11-077889

(51) Int. Cl.$^7$ ................................................. G11C 7/00
(52) U.S. Cl. ............................. 365/189.05; 365/230.06; 326/83; 327/108
(58) Field of Search ....................... 365/189.05, 230.06; 326/83, 86, 26, 97; 327/108, 170

(56) References Cited

U.S. PATENT DOCUMENTS

| 4,739,193 A | * | 4/1988 | Doty, II | 326/30 |
| 5,670,894 A | * | 9/1997 | Takaishi et al. | 326/27 |
| 5,903,500 A | * | 5/1999 | Tsang et al. | 365/189.05 |
| 6,072,729 A | * | 6/2000 | Casper | 365/189.05 |
| 6,181,176 B1 | * | 1/2001 | Nakano | 327/170 |

FOREIGN PATENT DOCUMENTS

JP         6-216742        8/1994

* cited by examiner

Primary Examiner—David Nelms
Assistant Examiner—Gene N. Auduong
(74) Attorney, Agent, or Firm—Oliff & Berridge, PLC

(57) ABSTRACT

The semiconductor of the present invention comprises: a buffer circuit (40) which operates by the supply of a first power source potential VDD1, and an N-type MOSFET (10) connected between a pad (20) pulled up to a second power source potential VDD2 and a ground. An output line (42) of the buffer circuit (40) is connected to a gate of the N-type MOSFET (10). The semiconductor further comprises a potential setting circuit (50) which sets a potential of the output line (42) of the buffer circuit (40) to a level lower than the threshold level of the N-type MOSFET (10) when the supply of the first power source potential VDD1 is shut off. This potential setting circuit (50) has a first and a second N-type MOSTETs (60, 70) which are connected in parallel between the output line (42) of the buffer circuit (40) and the ground. The first N-type MOSTET (60) has a gate connected to the output line (42) and functions as a forward diode. The second N-type MOSFET (70) has a gate connected to the pad (20) and is made conductive by a rise in the potential of the pad (20) to make the potential of the output line (42) to be the ground potential.

15 Claims, 11 Drawing Sheets

US 6,337,811 B1

SEMICONDUCTOR DEVICE HAVING SEMICONDUCTOR ELEMENT BECOMES OPERABLE WHEN CONNECTED TO EXTERNAL POWER SOURCE

TECHNICAL FIELD

The present invention relates to a semiconductor device, for example, to a circuit for improving the output characteristics of an output stage of a semiconductor device, Particularly, the present invention relates to a semiconductor device having a semiconductor element referred to as an open drain, an open collector or the like which becomes operable when connected to an external power source.

BACKGROUND ART

An open drain is conventionally known and used as an output stage of the above type of semiconductor device. For example, as shown in FIG. 11, such a semiconductor device has a structure in which the source of an N-type MOS transistor 10 constituting the output stage is connected to the ground, and the drain thereof in connected to a pad 20 which is an electrode used for external connection. In the semiconductor device having such a structure, a second power source potential VDD2 independent of a first power source potential VDD1 to be supplied to the inside of the semiconductor device is applied to the pad 20 via a pull-up resistor 30. A signal from a circuit (not shown) preceding a buffer circuit 40 is applied to the gate of this N-type MOS transistor 10 via the buffer circuit 40. The buffer circuit 40 operates by the supply of the first power source potential VDD1.

However, the following problem exists in the conventional devices having the above structure.

Specifically, when the first power source potential VDD1 to be supplied to the inside of the semiconductor device is shut off, the buffer circuit 40 becomes non-operational. For this reason, normally, the potential of an output line 42 of the buffer circuit 40 connected to the gate of the N-type MOS transistor 10 should become zero to make the MOS transistor 10 nonconductive. The potential of the pad 20 would be thereby held at the second power source potential VDD2. However, the potential of the output line 42 does not become zero in actual operation and the MOS transistor 10 becomes incompletely nonconductive. This brings about the problem that the potential of the pad 20 is not maintained at the second power source potential VDD2.

For example, if the potential of the pad 20 is not raised to the second power source potential VDD2 and another semiconductor chip is connected through the pad 20, the current may flow from the circuits of other semiconductor chips into the MOS transistor 10.

The inventor has directed his attention to fact that the above problem is caused because the potential of the output line 42 is not lowered sufficiently to make the MOS transistor 10 completely nonconductive due to parasitic capacitance and the like in a semiconductor substrate even if the supply of the first power source potential VDD1 is shut off, and achieved the present invention.

DISCLOSURE OF THE INVENTION

An objective of the present invention is to provide a semiconductor device which can reliably switch the operating state of a transistor to which a second power source potential is supplied according to the state of supply of a first power sources potential.

Another objective of the present invention is to provide a semiconductor device which can reliably switch the operating state of a transistor which is used as an open drain or open collector.

A further objective of the present invention is to provide a semiconductor device which can improve the operational reliability of an output stage thereof.

According to an aspect of the present invention, there is provided a semiconductor device according comprising:
    a buffer circuit which is operated by supply of a first power source potential;
    a transistor which is provided on a supply line of a second power source potential and has a gate connected to an output line of the buffer circuit; and
    a potential setting circuit which sets a potential of the output line of the buffer circuit to a level lower than the threshold level of the transistor, when the supply of the first power source potential is shut off.

In this aspect of the invention, when the supply of the first power source potential is shut off, the potential of the output line of the buffer, that is, the potential between the gate and source of the transistor is set to a level lower than the threshold level of the transistor. As a result of this, the transistor can be reliably made non-operational. Therefore, in contrast to the conventional art, the occurrence of such an event that the transistor becomes nonconductive only incompletely although the supply of the first power source potential in shut off can be reliably avoided.

The transistor may be an N-type MOS transistor. As an example of a case using an N-type MOS transistor, there is a case where the semiconductor device comprises a pull-up resistor and a pad to which the second power source potential is supplied through the pull-up resistor. In this case, the N-type MOS transistor is connected between the pad and a ground. In the case using the N-type MOSFET, the potential setting circuit may preferably set the potential of the output line of the buffer circuit to the ground potential when the supply of the first power source potential in shut off. This makes it possible to make the N-type MOS transistor completly nonconductive.

Preferred examples of the potential setting circuit will be described below.

The potential setting circuit may have a firs N-type MOS transistor and a second N-type MOSTET which are connected in parallel between the output line of the buffer circuit and the ground. The first N-type MOS transistor has a gate connected to the output line of the buffer circuit, and the second N-type transistor has a gate connected to the pad.

In this example, the first N-type MOS transistor functions as a diode forward-connected between the output line of the buffer circuit and the ground. Therefore, the potential of the output line of the buffer circuit can be reliably dropped to the threshold level of the first N-type MOSFET by the first N-type MOS transistor when the supply of the first power source potential is shut off. If the potential of the output line of the buffer circuit is designed to be equal to or less than the threshold level of the first N-type MOSFET, the N-type MOS transistor can be made nonconductive. And then if the potential of the pad is increased to a level equal to or higher than the threshold level of the second N-type MOS transistor, the second N-type MOS transistor becomes conductive. As a result, the potential of the output line of the buffer can be dropped to the ground potential.

In another example, the potential setting circuit may have a P-type MOS transistor connected between the output line of the buffer circuit and the ground The first power source potential may be supplied to a gate of the P-type MOS transistor. In this case, when the supply of the first power source potential is shut off, the P-type MOS transistor becomes conductive and the potential of the output line of the buffer circuit can be reliably dropped to the threshold level of the P-type MOS transistor. If the potential of the output line of the buffer circuit is made to a level equal to or less than the threshold level of the N-type MOS transistor, the N-type MOS transistor can be made nonconductive.

In a further example, the potential setting circuit may have a first N-type MOS transistor connected between the output line of the buffer circuit and the ground, and a potential applying circuit which applies a potential sufficient to take the first N-type MOS transistor conductive to a gate of the first N-type MOS transistor, when the supply of the first power source potential is shut off. The potential applying circuit may have: a second N-type MOSFET, a P-type MOS transistor, and a third N-type MOS transistor which are connected in series between a supply line of the first power source potential and the ground; and a capacitance connected between the ground and wiring for connecting the second N-type MOS transistor to the P-type MOS transistor. In this case, gates of the second N-type MOS transistor, P-type MOS transistor, and third N-type MOS transistor are connected to the supply line of the first power source potential.

In this example, electric charges are supplied to the capacitance when the first power source potential is supplied. When the supply of the first power source potential is shut off, a potential based on the charge supplied to the capacitance is applied to the gate of the first N-type MOS transistor and the first N-type MOS transistor is made conductive. Therefore, the potential of the output line of the buffer circuit is reliably change to the ground potential.

The above transistor may be a P-type MOS transistor instead of the N-type MOS transistor. Examples of a case using the P-type MOS transistor may include a case where the semiconductor device has a pull-down resistor and a pad to which the second power source potential is supplied through the pull-down resistor. In this case, the P-type MOS transistor is connected between the pad and a supply line of a third power source potential which in higher than the first power source potential.

When a P-type MOS transistor is used as the transistor, a similar structural example to the above various structural examples of the potential setting circuit for setting the gate potential of the N-type MOS transistor may be used. In this case, among the semiconductor elements constituting the potential setting circuit, the P-type must be replaced by N-types and the N-types must be replaced by P-types.

According to another aspect of the present invention, there in provided a semiconductor device comprising:

a buffer circuit which is operated by supply of a first power source potential;

a pull-up resistor;

a pad to which a second power source potential is supplied through the pull-up resistor;

a first N-type MOS transistor which is connected between the pad end a ground and has a gate connected to an output line of the buffer circuit; and a second N-type MOS transistor which is connected between the pad and the first N-type MOS transistor and has a gate connected to a supply line of the first power source potential.

In this aspect of the invention, when the supply of the first power source potential is shut off, the second N-type MOS transistor becomes nonconductive, and the potential of the pad can be made the second power source potential, regardless of the operational state of the first N-type MOS transistor.

According to a further aspect of the present invention, there is provided a semiconductor device comprising:

a buffer circuit which is operated by supply of a first power source potential;

a pull-down resistor;

a pad to which a second power source potential is supplied through the pull-down resistor;

a first P-type MOS transistor which is connected between the pad and a supply line of a third power source potential which is higher than the first power source potential, the first P-type MOS transistor having a gate connected to an output line of the buffer circuit; and a second N-type MOS transistor which in connected between the pad and the first P-type MOS transistor and has a gate connected to a supply line of the first power source potential.

In this aspect of the invention, when the supply of the first power source potential is shut off, the second P-type MOS transistor becomes nonconductive and the potential of the pad can be made the second power source potential, regardless of the operational state of the first P-type MOS transistor.

In this way, according to these aspects of the present invention, the potential between the gate and source of the output transistor can be kept at a level sufficient to make the output transistor completely non-operational when the power source of the buffer circuit in a stage preceding the output transistor as an open drain is shut off. For this reason, in contrast to the conventional art, the occurrence of such an event that the output transistor becomes incompletely non-operational and the potential of the drain does not reach a predetermined potential can be avoided. Accordingly, the operation of the output transistor can be stably and reliably switched, thereby improving the reliability of the circuit operations.

Also, since addition of several semiconductor elements in addition to the output transistor is sufficient, the operation of the output stage can be ensured by a simple structure.

BEST MODE FOR CARRYING OUT THE INVENTION

Figure 1:
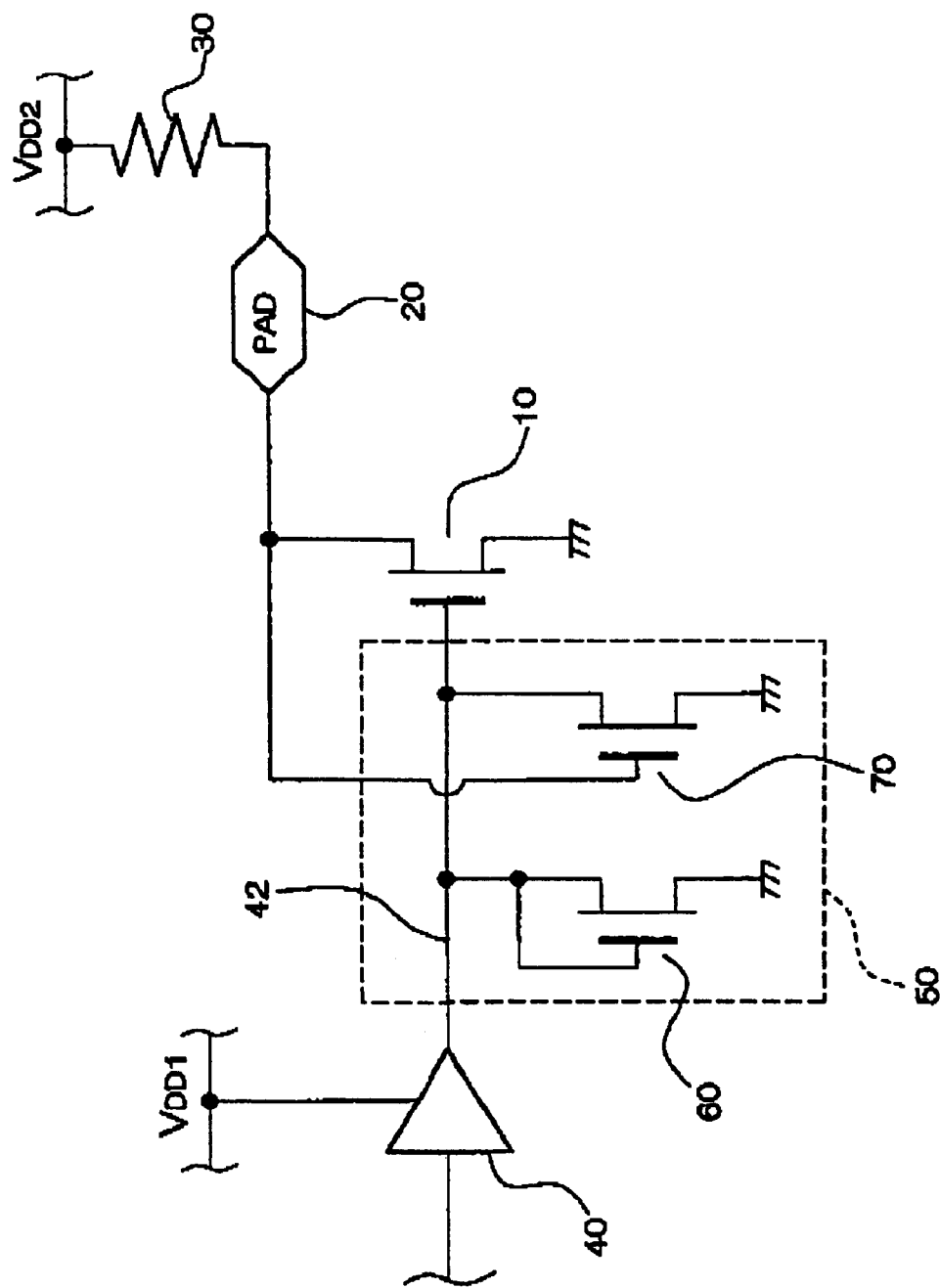
FIG. 1 is a circuit diagram showing an example of an output stage of a semiconductor device according to a first embodiment of the present invention.

Preferred embodiments of the present invention will be described with reference to the drawings. Note that components common to these embodiments are denoted by the same reference numbers and description thereof is omitted.
First Embodiment A semiconductor device according to a first embodiment of the present invention will be described with reference to FIG. 1. FIG. 1 is a view showing a circuit structure of an output stage of the semiconductor device.

An output transistor 10 disposed in the output stage may be formed of an N-type MOSFET (Metal Oxide Semiconductor Field Effect Transistor), for example. A source of the output transistor 10 in connected to the ground, while a drain thereof is connected to a pad 20 which is a terminal for external connection of the semiconductor device. A second power source potential VDD2 which is different from a first power source potential VDD1 to be supplied to the inside of the semiconductor device is applied to the pad 20 through a pull-up resistor 30.

An output line 42 of a buffer circuit 40 is connected to the gate of the output transistor 10. Signals from a circuit (not shown) preceding the buffer circuit 40 are supplied to the gate of the output transistor 10 through the buffer circuit 40. The buffer circuit 40 is operated by supply of the first power source potential VDD1 which is provided to the inside of the, semiconductor device.

The semiconductor device shown in FIG. 1 has a potential setting circuit 50 which sets the potential of the output line 42 of the buffer circuit 40 to a potential lower tan the threshold level of the output transistor 10 when the supply of the first power source potential VDD1 is shut off.

The potential setting circuit 50 has a first transistor 60 formed of an N-type MOSFET as in the case of the output transistor 10. The drain and gate of the first transistor 60 are interconnected and both connected to the output line 42 of the buffer circuit 40 and to the gate of the output transistor 10. The source of the first transistor 60 is connected to the ground. The first transistor 60 functions as a diode which is forward-connected between the output line 42 of the buffer circuit 40 and the ground. No current flows across the first transistor 60 insofar as a potential difference equal to or higher than the threshold level (corresponding to the contact potential of the diode) of the first transistor 60 is not produced between the output line 42 of the buffer circuit 40 and the ground.

Moreover, the potential setting circuit 50 has a second transistor 70 also formed of an N-type MOSFET. The drain of the second transistor 70 is connected to the output line 42 of the buffer circit 40 and to the gate of the output transistor 10, and the source of the second transistor 70 is connected to the ground. The gate of the second transistor 70 is connected to the drain of the output transistor 10 and to the pad 20.

In the semiconductor device formed in this manner, first, operations in the case where the first and second power source potentials VDD1 and VDD2 are both supplied normally will be described. For example, suppose that a signal corresponding to the logical value "High" is input to the buffer circuit 40 from a circuit in the preceding stage of the buffer circuit 40. In this case, a potential corresponding to the logical value "High" is also applied to the gate of the output transistor 10. The output transistor 10 thereby becomes conductive. Therefore, the potential of the pad 20 becomes zero.

Under such conditions, the second transistor 70 also becomes non-conductive since the gate potential of the second transistor 70 becomes zero. For this reason, the potential of the output line 42 of the buffer circuit 40 is kept at a level corresponding to the logical value "Hight" and the transistor 70 has no influence on the conducting action of the output transistor 10.

Then, if the supply of the first power source potential VDD1 is shut off while the supply of the second power source potential VDD2 is maintained, operations are as follows. First, the buffer circuit 40 is made non-operational. If the potential of the output line 42 of the buffer circuit 40 in not changed to zero but a small potential is generated for some reason or other, things became as follows.

Even in such a case, the potential of the output line 42 of the buffer circuit 40 will not rise to a level higher than the threshold level VTHN of the output transistor 10 with the aid of the first transistor 60 which functions as a diode connected between the output line 42 and the ground. To state in more detail, if a slight potential generated in the output line 42 of the buffer circuit 40 is higher than the threshold level of the first transistor 60 which functions as a forward diode, current flows across the first transistor 60 and the potential of the output line 42 of the buffer circuit 40 can therefore be dropped. If the dropped potential is equal to or lower than the threshold level VTHN of the output transistor 10, the output transistor 10 will not become conductive.

On the other hand, by shutting off the supply of the first power source potential VDD1, the output transistor 10 is made nonconductive. As a result of this, the potential of the pad is increased. If the potential of the pad 20 exceeds the threshold level of the second transistor 70, the second transistor 70 becomes conductive. The potential of the output line 42 of the buffer circuit 40 becomes the ground potential, that is, a zero potential. Consequently, the output transistor 10 having a gate connected to the output line 42 is reliably made nonconductive.
Second Embodiment An example of a circuit structure according to a second embodiment of the present invention will be described with reference to FIG. 2. The structural components in FIG. 2 corresponding to those in FIG. 1 are denoted by the same reference numbers and detailed description is omitted, and the following description will center on different points.

Signals from a stage preceding the buffer circuit 40 are supplied to the gate of the output transistor 10 through the buffer circuit 40 in a similar manner to the example in FIG. 1.

Figure 2:
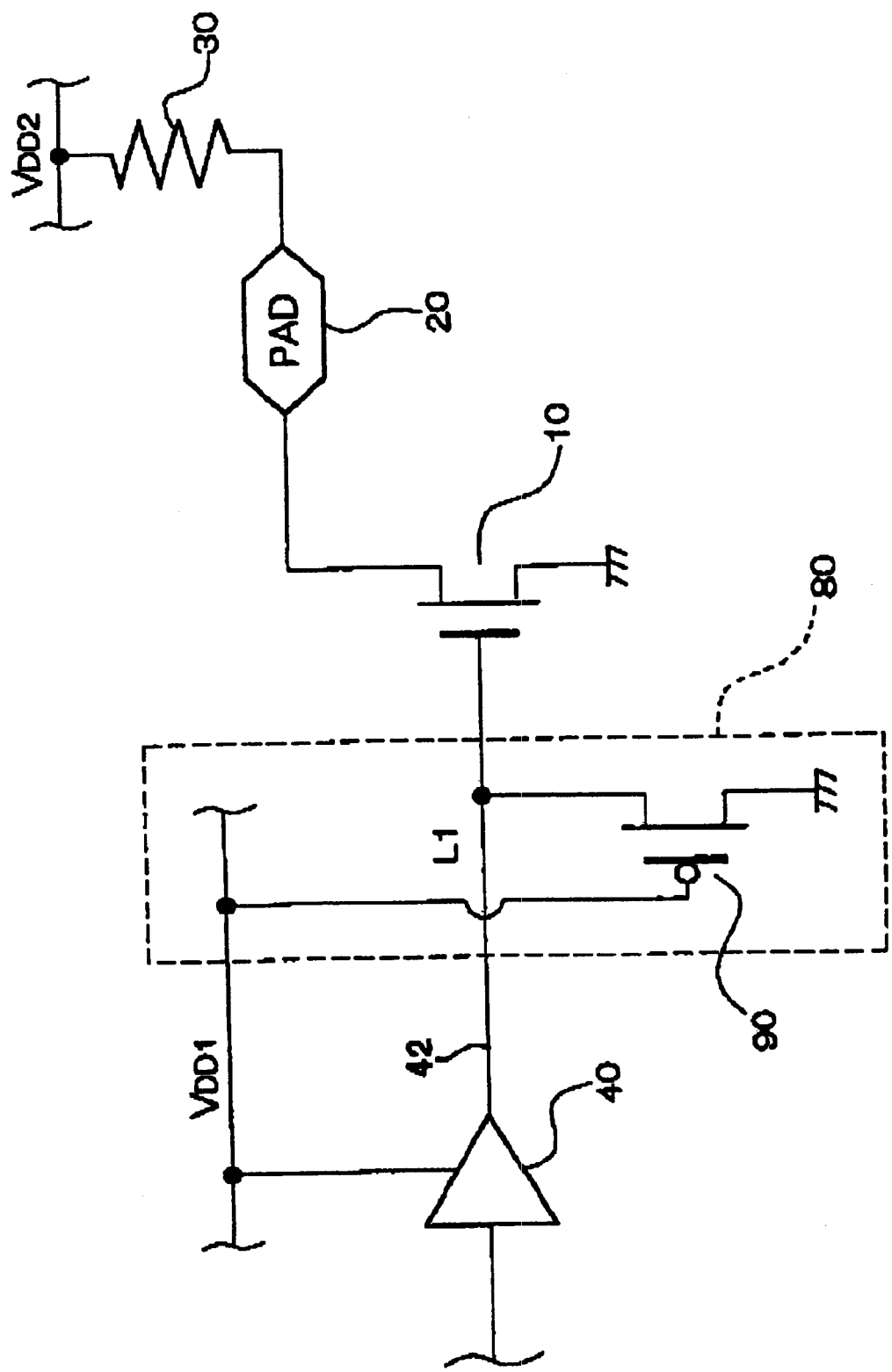
FIG. 2 is a circuit diagram showing an example of an output stage of a semiconductor device according to a second embodiment of the present invention.

In FIG. 2, a potential setting circuit 80 having P-type transistor 90 formed of a P-type MOSFET is disposed instead of the potential setting circuit 50 having the first and second transistors 60 and 70 shown in FIG. 1. The drain of the P-type transistor 90 is connected to the output line 42 of the buffer circuit 40 and to the gate of an output transistor 10. The source of the P-type transistor 90 is connected to the ground. The first power source potential VDD1 is applied to the gate of the P-type transistor 90.

Operations in the second embodiment when the first and second power source potentials VDD1 and VDD2 are both normally supplied will be first described. For example, suppose that a signal corresponding to the logical value "High" is input to the buffer circuit 40 from a circuit preceding the buffer circuit 40. In this case, a potential corresponding to the logical value "High" is also applied to the gate of the output transistor 10. The output transistor 10 is thereby made conductive. Therefore, the potential of the pad 20 becomes zero. Also, the P-type transistor 90 in nonconductive since the first power source potential VDD1 is applied to the gate of the P-type transistor 90. For this reason, the potential of the output line 42 of the buffer 40 is kept at a potential corresponding to the logical value "High", and the P-type transistor 90 has no influence on the conducting action of the output transistor 10.

Next, operations when the supply of the first power source potential VDD1 in shut off while the supply of the second power source potential VDD2 is maintained will be described. In this case, the P-type transistor 90 is made conductive and the potential of the gate of the output transistor 10 is thereby changed to substantially the ground potential. Therefore, the output transistor 10 is made nonconductive and the potential of the pad 20 is changed to the second power source potential Third Embodiment An example of a circuit structure according to a third embodiment of the present invention will be described with reference to FIG. 3. The structure components in FIG. 3 corresponding to those in FIG. 1 are denoted by the same reference numbers and detailed description is omitted. The following description about the example of FIG. 3 will center on points which are different from the example of FIG. 1.

Figure 3:
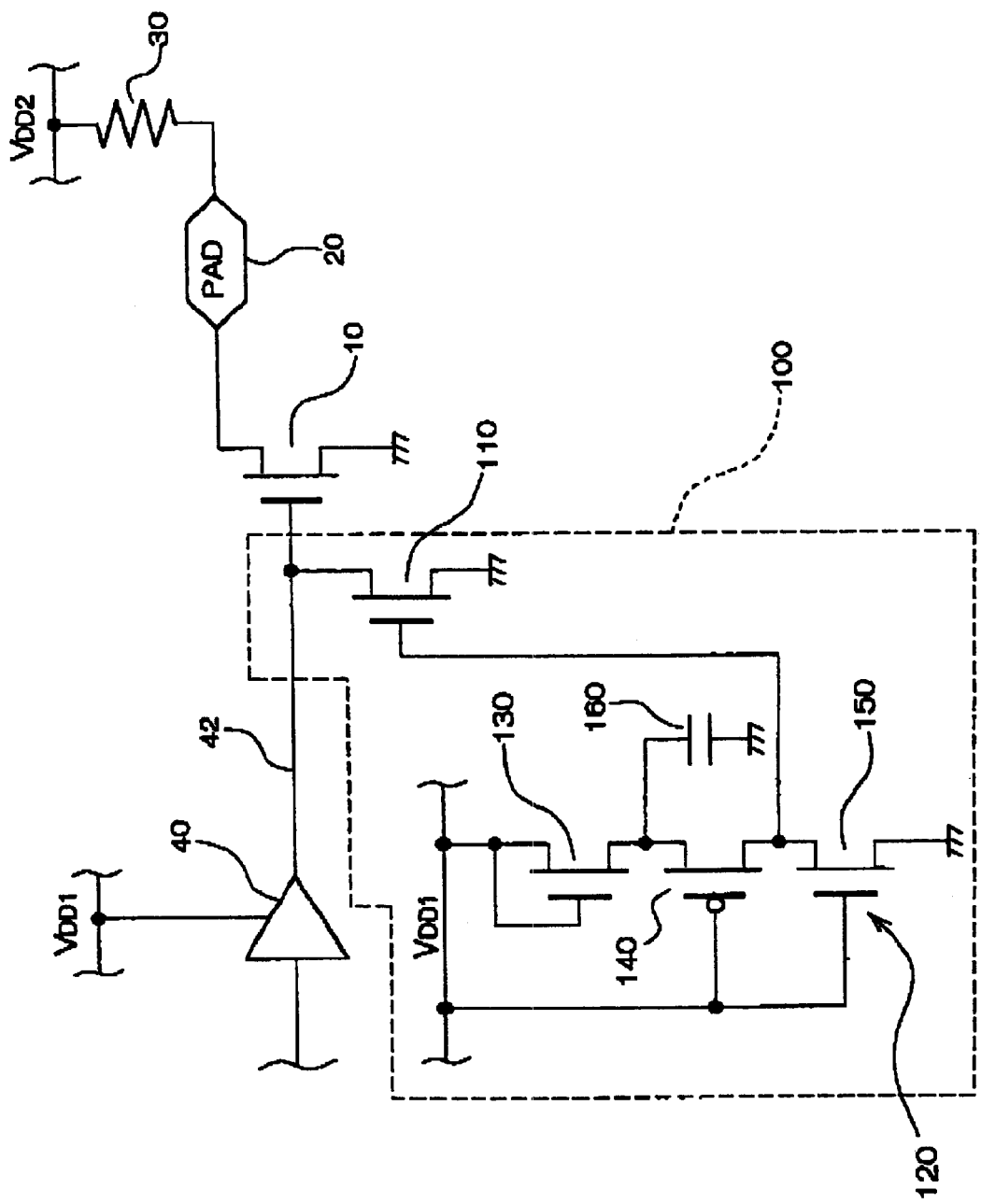
FIG. 3 is a circuit diagram showing an example of an output stage of a semiconductor device according to a third embodiment of the present invention.

A potential setting circuit 100 shown in FIG. 3 has a first N-type transistor 110 and a potential applying circuit 120 which applies a zero potential to the gate of the first N-type transistor 110 when the supply of a first power source potential. VDD1 is shut off.

The drain of the first N-type transistor 110 formed of an N-type MOSFET is connected to the output line 42 of the buffer circuit 40 and to the gate of the output transistor 10, and the source of the N-type transistor 110 is connected to the ground.

The potential applying circuit 120 has a second N-type transistor 130, a P-type transistor 140, and a third N-type transistor 150 which are connected in series between a power supply line of the first power source potential VDD1 and the ground. The second transistor 130 formed of an N-type MOSFET functions as a diode by connecting its gate to its drain. The first power source potential VDD1 is applied to the drain of the second N-type transistor 130.

The source of the second N-type transistor 130 is connected to the drain of the P-type transistor 120 formed of a P-type MOSFET, and also to one end of a capacitance 160. The other end of the capacitance 160 is connected to the ground.

The source of the second transistor 130 is connected to the drain of the third transistor 150 formed of an N-type MOSFET and also to the gate of the first N-type transistor 110. The source of the third transistor 150 is connected to the ground. The first power source potential VDD1 is applied to the gates of the P-type transistor 140 and the third N-type transistor 150.

Operations in an output stage of the semiconductor device shown in FIG. 3 will be described. First, operations when the first and second power source potentials VDD1 and VDD2 are both normally supplied will be described. Suppose that a signal corresponding to the logical value "High" is input to the buffer circuit 40. The output transistor 10 is thereby made conductive and the potential of the pad 20 becomes zero in a similar manner to the circuit structure in FIG. 1.

Under such conditions, the first power source potential VDD1 is applied to the gates of the P-type transistor 140 and the third N-type transistor 150. For this reason, the third transistor 150 becomes conductive and the P-type transistor 140 becomes nonconductive. The first N-type transistor 110 is thereby made nonconductive because the potential of its gate is changed to the ground potential. Therefore, the potential of the output line of the buffer circuit 40 is kept at a level corresponding to the logical value "High" and the first N-type transistor 110 does not hinder the conducting action of the output transistor 10.

In this case, the capacitance 160 is resultantly charged to have a predetermined potential. This predetermined potential means a potential obtained by subtracting a potential drop (the threshold level VTHN of the second N-type transistor 130) in the second N-type transistor 130 from the first power source potential VDD1.

Subsequently, if the supply of the first power source potential VDD1 is shut off while the supply of the second power source potential VDD2 is maintained, the buffer circuit 40 is made non-operational.

By the shutoff of the supply of the first power source potential VDD1, the third transistor 130 is made nonconductive and the P-type transistor 140 is made conductive. Consequently, the charged potential of the capacitance 160 is applied to the gate of the first N-type transistor 110.

Therefore, the first N-type transistor 110 is made conductive and the potential of the gate of the output transistor 10 is changed to the ground potential, that is, a zero potential. In this way, when the supply of the first power source potential VDD1 it shut off while the second power source potential VDD2 is maintained, the output transistor 10 is reliably made nonconductive.

Fourth Embodiment

An example of a circuit structure according to a fourth embodiment of the present invention will be described with reference to FIG. 4. The structural components in FIG. 4 corresponding to those in FIG. 1 are denoted by the same reference numbers and detailed description is omitted. The following description will center on the points which are different from the example of FIG. 1.

In contrast to the circuit structure in FIG. 1, the drain of an output transistor 10 (first transistor) is connected to the pad 20 through a second transistor 170. In other words, the first and second transistors 10 and 170 are connected in series between the pad 20 and the ground.

The gate of the output transistor 10 is connected to the output line 42 of the buffer circuit 40 in the same manner as the circuit structure of FIG. 1. In this structure, however, the source of the second transistor 170 formed of an N-type MOSFET is connected to the drain of the output transistor 10 and the drain of the second transistor 170 is connected to the pad 20. The first power source potential VDD1 is applied to the gate of the second transistor 170.

In the fourth embodiment, when both the first and second power source potentials VDD1 and VDD2 are normally supplied, the first power source potential VDD1 is applied to the gate of the second transistor 170 and the second transistor 170 is made conductive. If a signal corresponding to the logical value "High" is applied to the buffer circuit 40 from a circuit (not shown) preceding the buffer circuit 40, for example, the output transistor 10 becomes conductive and the drain of the output transistor 10 is connected to the pad 20 through the second transistor 170 which is conductive. The potential of the pad 20 therefore becomes zero.

Suppose that only the supply of the first power source potential VDD1 is shut off and the supply of the second power source potential VDD2 is maintained. In this case, the buffer circuit 40 becomes non-operational and the second transistor 170 becomes nonconductive. The potential of the gate of the output transistor 10 is incompletely changed to the ground potential. Even if the gate of the output transistor 10 has a potential sufficient to make the output transistor 10 conductive, this has no influence on the potential of the pad 20. This in because the potential of the pad 20 is maintained at the second power source potential VDD2 by the nonconductive second transistor 170.

Output Characteristics

Figure 5:
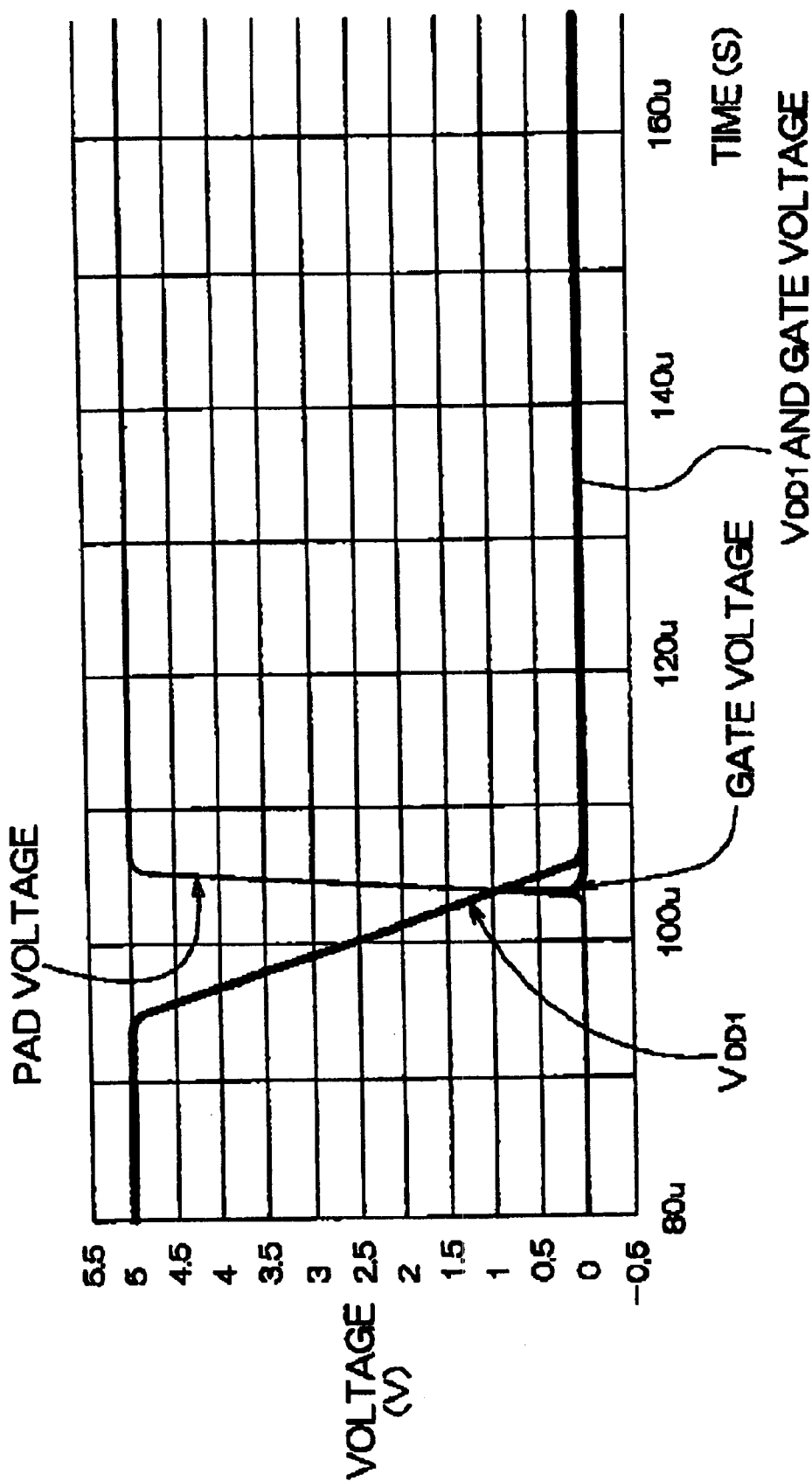
FIG. 5 is a characteristic graph showing an example of the output characteristic of a semiconductor device to which the prevent invention is applied.

FIG. 5 shows an example of the output characteristics of the above-described semiconductor device. Specifically, FIG. 5 shows variation in the gate potential of the output transistor 10 and variation in the potential of the pad 20 when the first power source potential VDD1 is shut off. In FIG. 5, time (units second) is plotted along the horizontal axis and potential (unit: volt) is plotted along the vertical axis.

In this graph, the first power source potential VDD1 drown to 0 V at the time between 95 µs and 105 µs. In FIG. 5, the characteristic curve showing variation in the first power source potential VDD1 substantially overlaps with the characteristic curve showing variation in the gate potential of the output transistor 10.

Specifically, the gate potential of the output transistor 10 completely drops to 0 V around the time when the potential of the pad 20 rises to about 0.8 V. The potential of the pad 20 reaches 5 V at almost the same time when the first power source potential VDD1 drops to 0 V.

Figure 6:
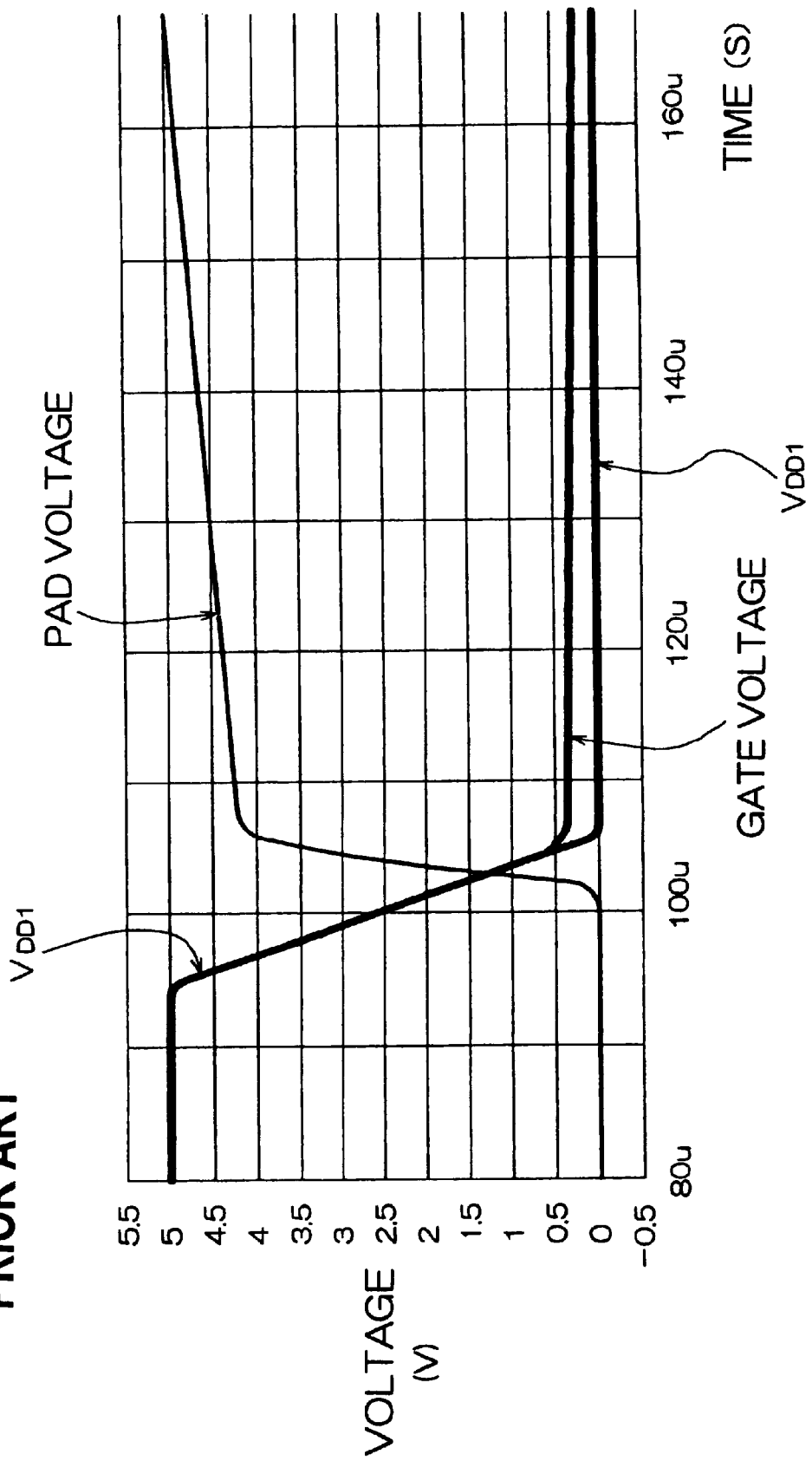
FIG. 6 is a characteristic graph showing an example of the output characteristic in a conventional circuit.

In contrast, the output characteristics of a conventional circuit are as shown in FIG. 6. In FIG. 6, even if the first power source potential VDD1 reaches 0 V, the gate potential of the output transistor 10 does not drop completely to 0. In this case, the gate potential is retained at about 0.3 V. For this reason, the potential of the pad 20 does not reach the second power source potential, that is, 5 V even if the first power source potential VDD1 reaches 0 V. Thereafter, as the gates potential of the output transistor 10 gradually decreases, the potential of the pad 20 gradually approaches 5 V, and reaches 5 V for the first time several msec after the first power source potential VDD1 reaches 0 V, though not shown in FIG. 6.

In the output characteristics shown in FIG. 5, compared with the characteristics of the conventional circuit, the gate potential of the output transistor 10 reliably drops to 0 V exactly when the first power source potential VDD1 reaches 0 V. Therefore, the potential of the pad 20 immediately reaches 5 V, showing that the output characteristics are more improved than those of the conventional circuit.

Fifth to Eighth Embodiments

The above embodiments of the invention illustrate the circuit structures with the output transistor 10 being an N-type MOSFET. The present invention may also be applied to circuit structures with the output transistor being a P-type MOSFET. FIGS. 7 to 10 show fifth to eighth embodiments which are modifications of the above first to fourth embodiments shown in FIGS. 1 to 4. A P-type MOSFET is used as the output transistor.

First, structures common to FIGS. 7 to 10 will be described. In FIGS. 7 to 10, an output transistor 200 is formed of a P-type MOSFET. A first power source potential VSS1 and a second power source potential VSS2 shown In FIG. 7 to FIG. 10 are negative potentials lower than 0 V. A third power source potential VDD1, which is a reference potential for the first power source potential VSS1, is 0 V, higher than the first power source potential VSS1. If a power source within the semiconductor device is shut off, the first and third power source potentials VSS1 and VDD1 both become 0 V.

The output transistor 200 is connected between a pad 210 and a supply line of the third power source potential VDD1.

The second power source potential VSS2 is supplied to the pad 210 through a pull-down resistor 220. An output line 232 of the buffer circuit 230, which operates with the supply of the first power source potential VSS1, is connected to the gate of the output transistor 200.

In the output circuits shown in FIGS. 7 to 10, when a signal corresponding to the logical value "Low" is output from the buffer circuit 230 while the first and second power source potentials VSS1 and VSS2 are supplied, the output transistor 200 is made conductive and the potential of the pad 210 becomes the third power source potential VDD1 (0 V). Subsequently, even if the supply of the first power source potential VSS1 is shut off, the potential of the output line 232 of the buffer 230 may not rise to the third power source potential VDD1 (0 V) for the same reason as described above.

Figure 7:
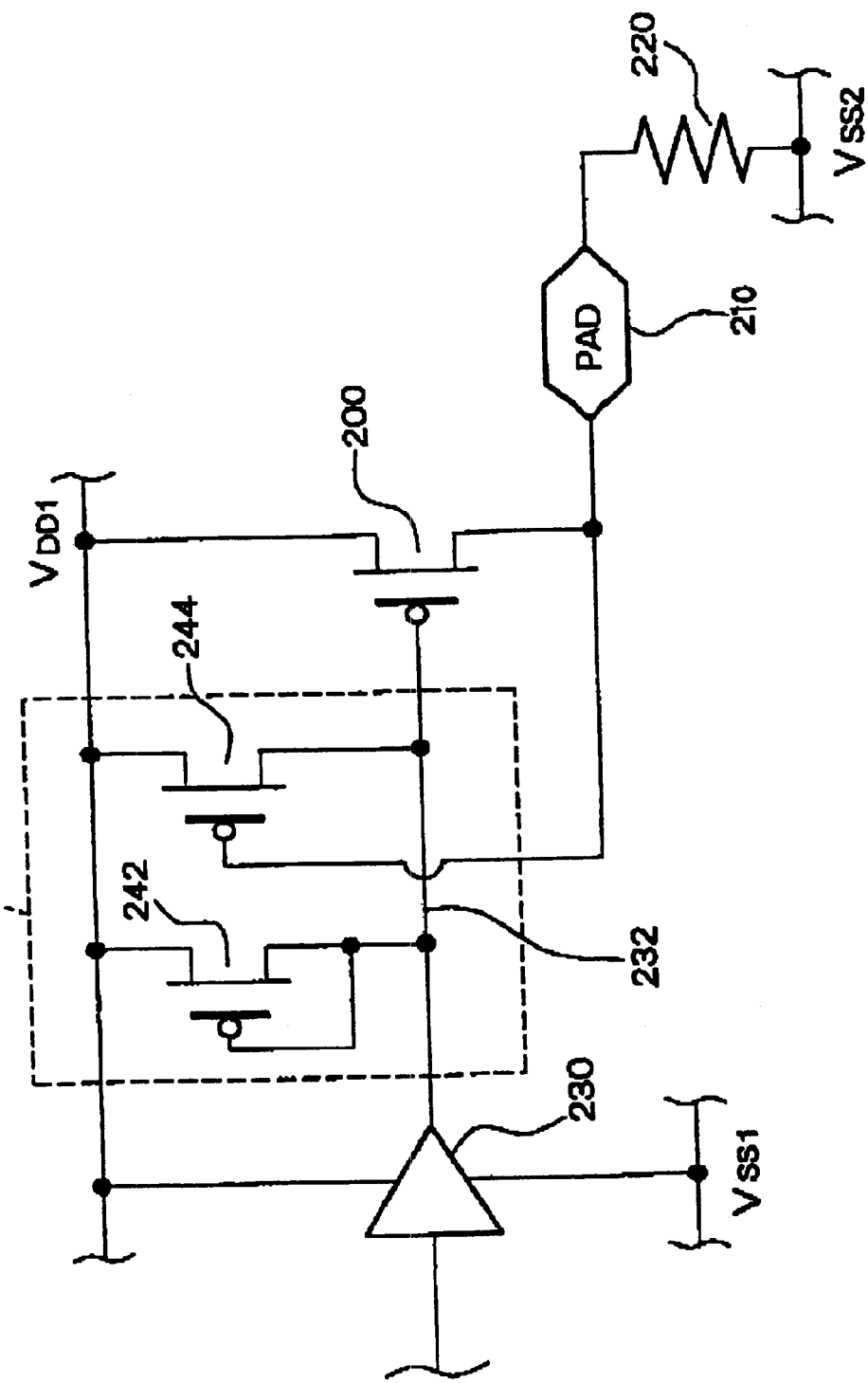
FIG. 7 is a circuit diagram showing an example of an output stage of a semiconductor device according to a fifth embodiment of the present invention.

In the fifth embodiment shown in FIG. 7, a potential setting circuit 240 having a first transistor 242 and a second transistor 244 which are respectively P-type MOSFETs, is disposed instead of the potential setting circuit 50 shown in FIG. 1 The first transistor 242 shown in FIG. 7 operates in a similar manner to the first transistor 60 in FIG. 1, and the second transistor 244 shown in FIG. 7 operates in a similar manner to the second transistor 70 in FIG. 1. The potential setting circuit 240 sets the potential of the output line 232 to the third power source potential VDD1 (0 V) which is higher than the threshold level VTHP of the output transistor 200, when the supply of the first power source potential VSS1 is shut off.

Figure 8:
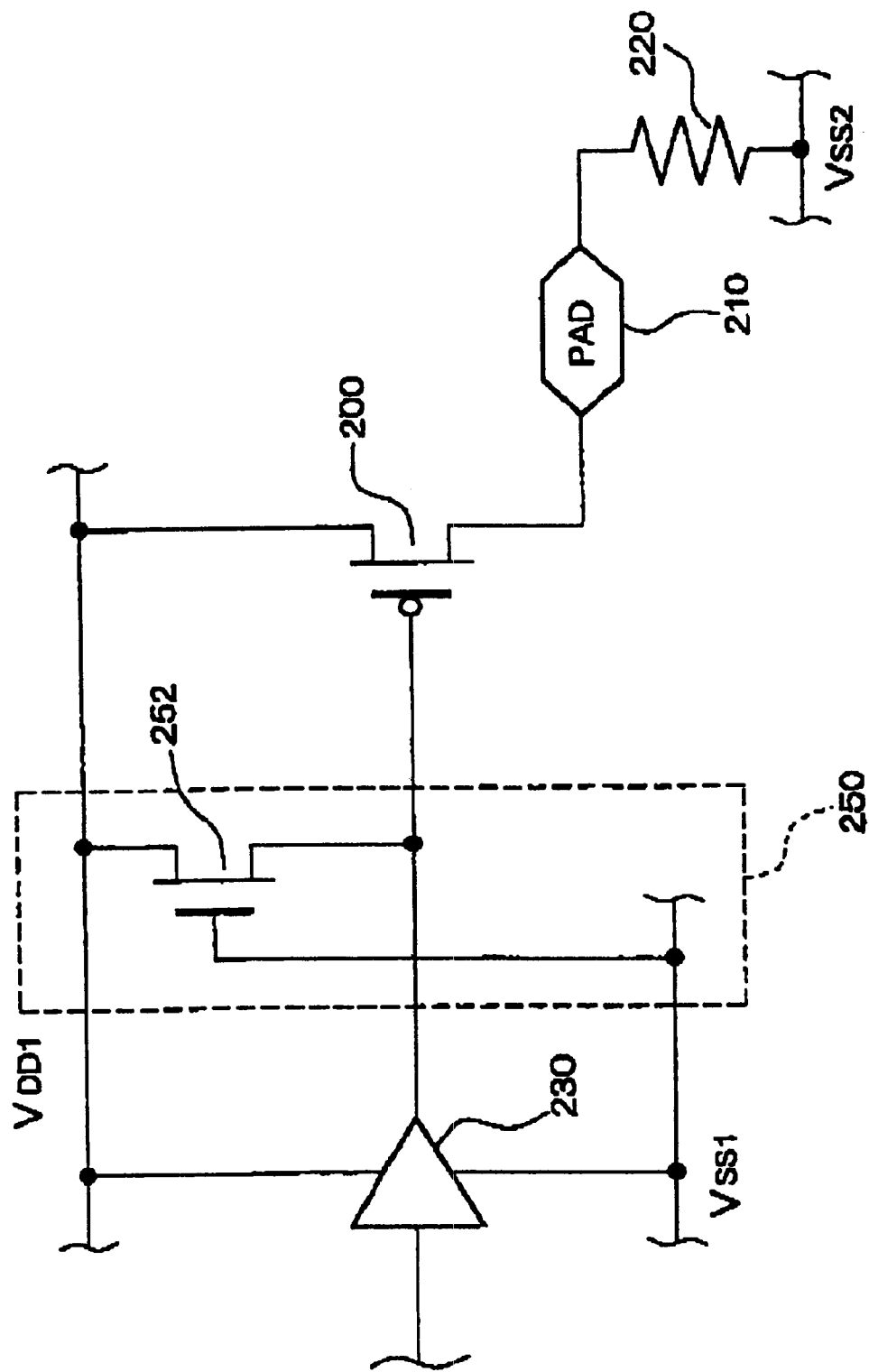
FIG. 8 is a circuit diagram showing an example of an output stage of a semiconductor device according to a sixth embodiment of the present invention.

In the sixth embodiment shown in FIG. 8, a potential setting circuit 250 having an N-type MOSFET 252 is disposed instead of the potential setting circuit 80 shown in FIG. 2. The N-type MOSFET 252 shown in FIG. 8 operates in the same manner as the P-type MOSFET 90 shown in FIG. 2. When the supply of the first power source potential VSS1 is shut off, the potential setting circuit 250 sets the potential of the output line 232 to the third power source potential VDD1 (0 V) which is higher than the threshold level VTHP of the output transistor 200.

Figure 9:
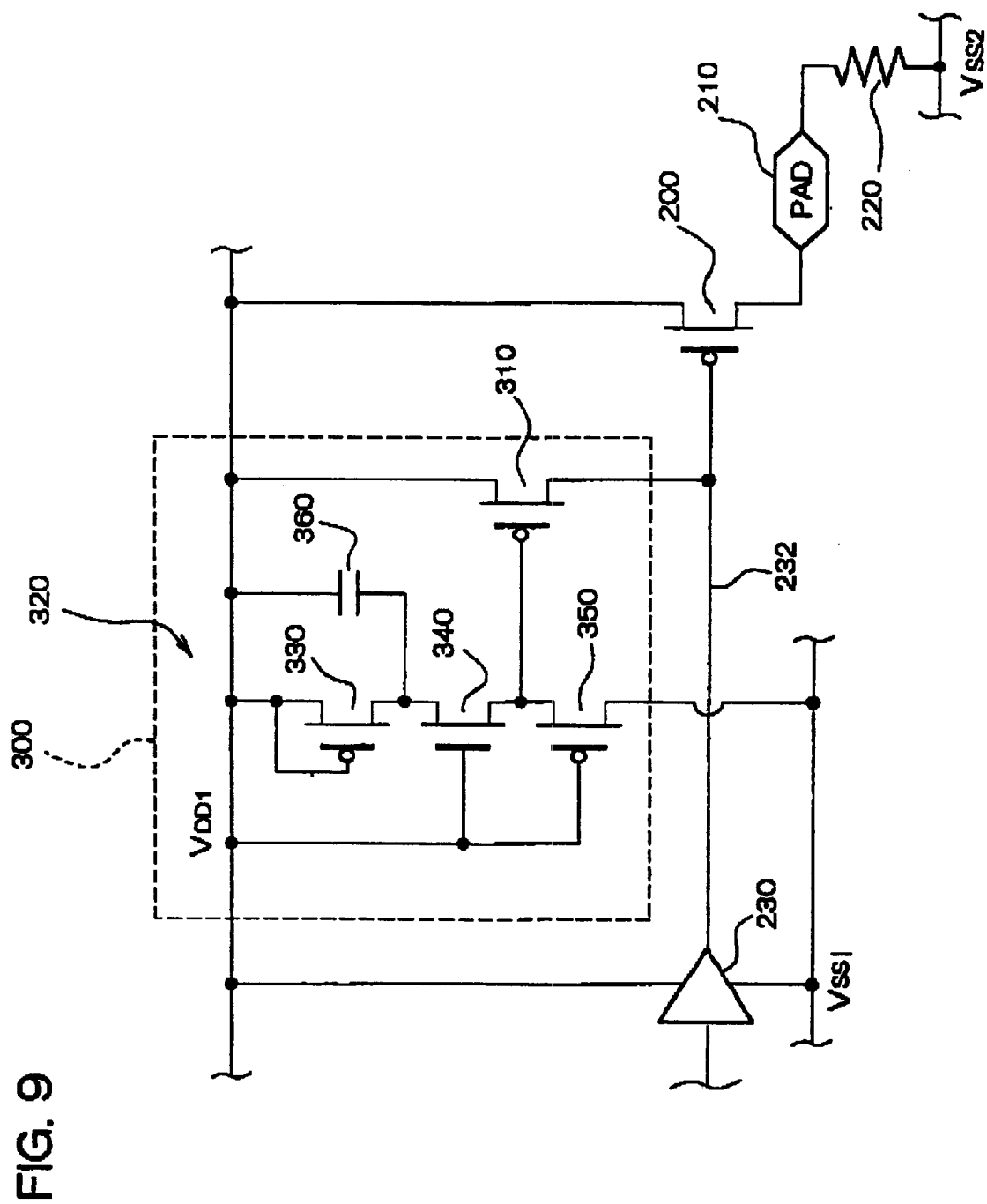
FIG. 9 is a circuit diagram showing an example of an output stage of a semiconductor device according to a seventh embodiment of the present invention.

In the seventh embodiment shown in FIG. 9, a potential setting circuit 300 is disposed in place of the potential setting circuit 100 shown in FIG. 3. The potential setting circuit 300 shown in FIG. 9 has a first P-type MOSFET 310 which operates in the same manner as the first N-type MOSFET 110 shown in FIG. 3, and a potential applying circuit 320 which operates in the same manner as the potential applying circuit 120 shown in FIG. 3. The potential applying circuit 320 has a second P-type MOSFET 330, an N-type MOSFET 340, a third P-type MOSFET 350, and a capacitance 360. These devices operate in the same manner as the second N-type transistor 130, P-type transistor 140, third N-type transistor 150, and capacitance 160, respectively. The operation of the potential applying circuit 320 ensures that when the first power source potential VSS1 is shut off, the charged voltage of the capacitance 360 is applied to the gate of the first P-type MOSFET 310 and the first P-type transistor 310 is made conductive. Accordingly, the output transistor 200 is reliably made nonconductive.

Figure 4:
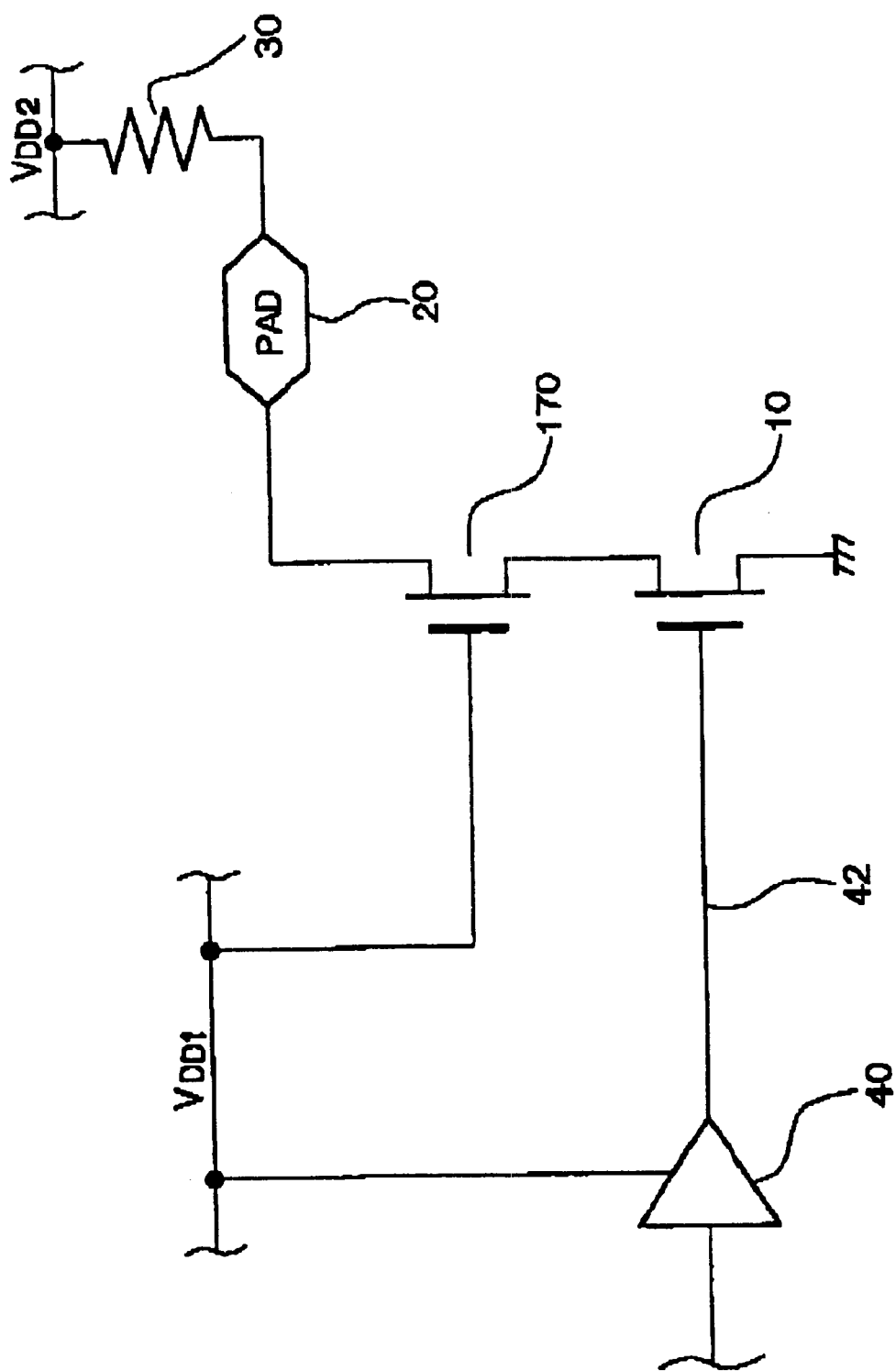
FIG. 4 is a circuit diagram showing an example of an output stage of a semiconductor device according to a fourth embodiment of the present invention.
Figure 10:
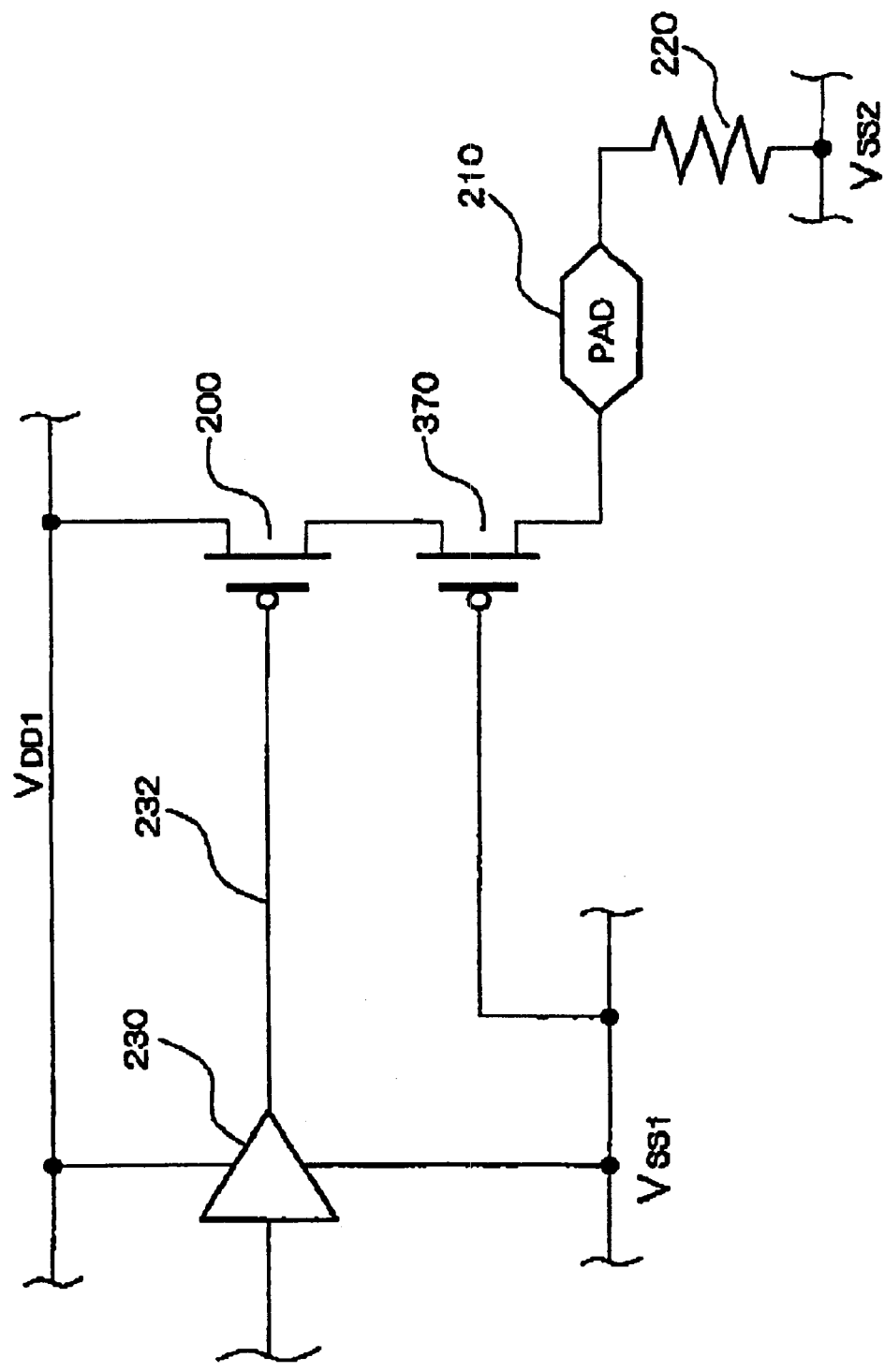
FIG. 10 is a circuit diagram showing an example of an output stage of a semiconductor device according to an eighth embodiment of the present invention.
Figure 11:
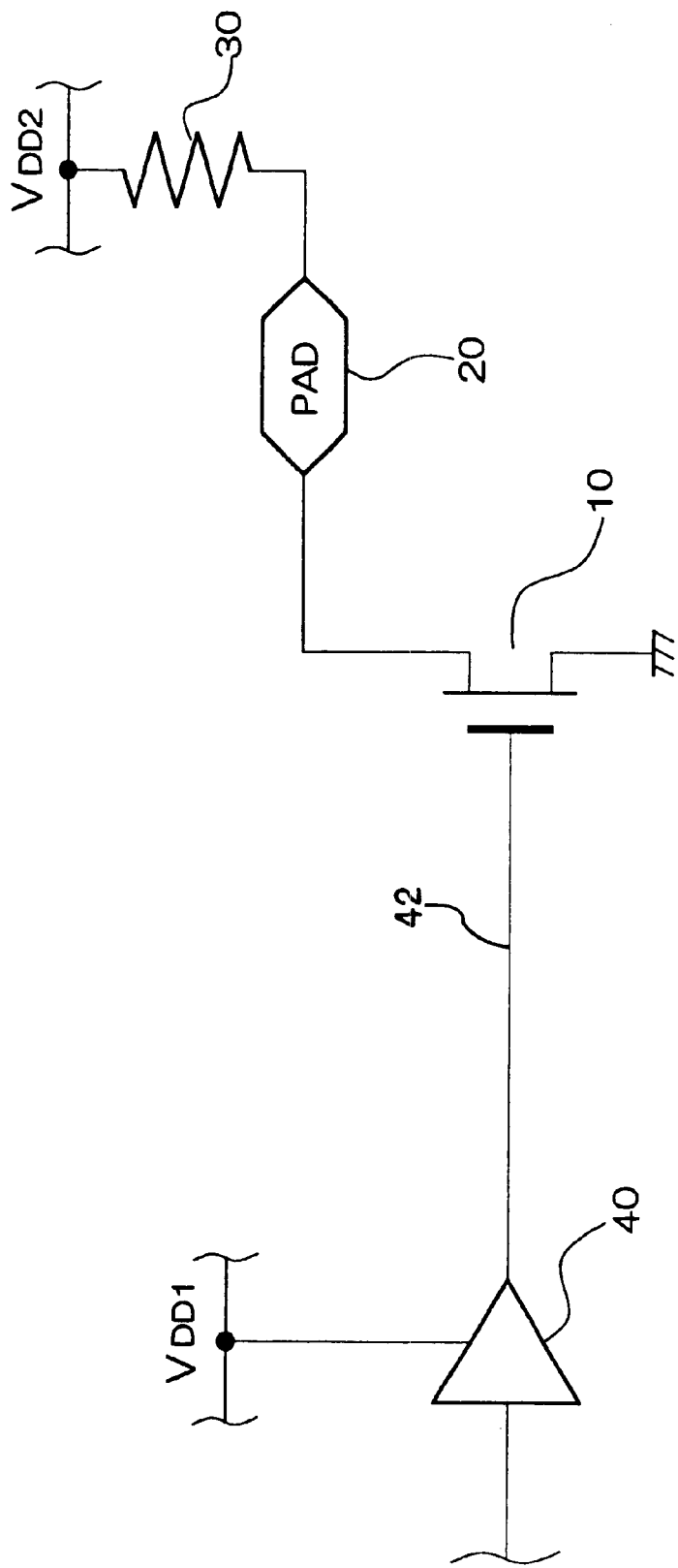
FIG. 11 is a circuit diagram showing an output circuit in a conventional semiconductor device.

In the eighth embodiment shown in FIG. 10, a second P-type MOSFET 370 is disposed in place of the N-type MOSFET 170 shown in FIG. 4. Because the second P-type MOSFET 370 is made nonconductive when the first power source potential VSS1 is shut off, the potential of the pad 210 can be set to the second power source potential VSS2 regardless of the operating state of the output transistor 200

The present invention is applied to the output stage of a semiconductor device in the above embodiments, but the present invention is not necessarily limited thereto. The present invention may be applied to any circuit structure as far as the power source potential of a buffer circuit and the power source potential to be applied to the drain of the transistor connected to the buffer circuit are made independent of and separated from each other.

What is claimed is:

1. A semiconductor device comprising:
a buffer circuit which is operated by supply of a first power source potential;
a transistor which is provided on a supply line of a second power source potential and has a gate connected to an output line of the buffer circuit; and
a potential setting circuit which sets a potential of the output line of the buffer circuit to a level lower than the threshold level of the transistor, when the supply of the first power source potential is shut off.

2. The semiconductor devise as defined in claim 1, wherein the transistor is an N-type MOS transistor.

3. The semiconductor device as defined in claim 2, further comprising a pull-up resistor and a pad to which the second power source potential is supplied through thu pull-up resistor,
wherein the N-type MOS transistor is connected between the pad and a ground.

4. The semiconductor device as defined in claim 3,
wherein the potential setting circuit has a first N-type MOS transistor and a second N-type MOS transistor which are connected in parallel between the output line of the buffer circuit and the ground;
wherein the first N-type MOS transistor has a gate connected to the output line of the buffer circuit; and
wherein the second N-type MOS transistor has a gate connected to the pad.

5. The semiconductor device as defined in claim 3,
wherein the potential setting circuit has a P-type MOS transistor connected between the output line of the buffer circuit and the ground; and
wherein the first power source potential is supplied to a gate of the P-type MOS transistor.

6. The semiconductor device as defined in claim 3, wherein the potential setting circuit has:
a first N-type MOS transistor connected between the output line of the buffer circuit and the ground; and
a potential applying circuit which applies a potential sufficient to make the first N-type MOS transistor conductive to a gate of the first N-type MOS transistor, when the supply of the first power source potential is shut off.

7. The semiconductor device as defined in claim 6,
wherein the potential applying circuit has:
a second N-type MOS transistor, a P-type MOS transistor, and a third N-type MOS transistor which are connected in series between a supply line of the first power source potential and the ground; and
a capacitance connected between the ground and wiring for connecting the second N-type MOS transistor to the P-type MOSFET, and
wherein gates of the second N-type MOS transistor, P-type MOS transistor, and third N-type MOS transistor are connected to the supply line of the first power source potential.

8. The semiconductor device an defined in claim 1, wherein the transistor is a P-type MOS transistor.

9. The semiconductor device as defined in claim 8, further comprising a pull-down resistor and a pad to which the second power source potential is supplied through the pull-down resistor;
wherein the P-type MOS transistor is connected between the pad and a supply line of a third power source potential which is higher than the first power source potential.

10. The semiconductor device as defined in claim 9,
wherein the potential setting circuit has a first P-type MOSTET and a second P-type MOS transistor which is connected in parallel between the output line of the buffer circuit and the supply line of the third power source potential;
wherein the first P-type MOS transistor has a gate connected to the output line of the buffer circuit; and
wherein the second P-type MOS transistor has a gate connected to the pad.

11. The semiconductor device as defined in claim 9,
wherein the potential setting circuit has an N-type MOS transistor connected between the output line of the buffer circuit and the supply line of the third power source potential; and
wherein the first power source potential is supplied to a gate of the N-type MOS transistor.

12. The semiconductor device as defined in claim 9, wherein the potential setting circuit has:
a first P-type MOS transistor connected between the output line of the buffer circuit and the supply line of the third power source potential; and
a potential applying circuit which applies a potential sufficient to make the first P-type MOS transistor conductive to a gate of the first P-type MOS transistor, when the supply of the first power source potential is shut off.

13. The semiconductor device as defined in claim 9,
wherein the potential applying circuit has:
a second P-type MOS transistor, an N-type MOSFET, and a third P-type MOS transistor which are connected in series between a supply line of the first power source potential and the supply line of the third power source potential; and
a capacitance connected between wiring for connecting the second P-type MOS transistor to the N-type MOSFET and the supply line of the third power source potential;
wherein gates of the second P-type MOS transistor, N-type MOS transistor, and third P-type MOS transistor are connected to the supply line of the first power source potential.

14. A semiconductor device comprising:
a buffer circuit which is operated by supply of a first power source potential;
a pull-up resistor;
a pad to which a second power source potential is supplied through the pull-up resistor;
a first N-type MOS transistor which is connected between the pad and a ground and has a gate connected to an output line of the buffer circuit; and
a second N-type MOS transistor which is connected between the pad and the first N-type MOS transistor and has a gate connected to a supply line of the first power source potential.

15. A semiconductor device comprising:
   a buffer circuit which is operated by supply of a first power source potential;
   a pull-down resistor;
   a pad to which a second power source potential is supplied through the pull-down resistor;
   a first P-type MOS transistor which in connected between the pad and a supply line of a third power source potential which is higher than the first power source potential, the first P-type MOS transistor having a gate connected to an output line of the buffer circuit; and
   a second N-type MOS transistor which is connected between the pad and the first N-type MOS transistor and has a gate connected to a supply line of the first power source potential.

* * * * *